(12) United States Patent
Elsaadani et al.

(10) Patent No.: US 11,661,965 B2
(45) Date of Patent: May 30, 2023

(54) FASTENER AND VENT DEVICE FOR TELECOMMUNICATIONS EQUIPMENT

(71) Applicant: Nokia Shanghai Bell Co., Ltd., Shanghai (CN)

(72) Inventors: Asaad Elsaadani, Meriden, CT (US); William Wilber, Killingworth, CT (US)

(73) Assignee: Nokia Shanghai Bell Co., Ltd., Shanghai (CN)

( * ) Notice: Subject to any disclaimer, the term of this patent is extended or adjusted under 35 U.S.C. 154(b) by 295 days.

(21) Appl. No.: 17/068,943

(22) Filed: Oct. 13, 2020

(65) Prior Publication Data

US 2021/0108667 A1     Apr. 15, 2021

Related U.S. Application Data

(60) Provisional application No. 62/914,707, filed on Oct. 14, 2019.

(51) Int. Cl.
| | | |
|---|---|---|
| *F16B 33/00* | (2006.01) | |
| *F16B 23/00* | (2006.01) | |
| *H05K 7/20* | (2006.01) | |
| *H05K 5/03* | (2006.01) | |

(52) U.S. Cl.
CPC ............ *F16B 33/004* (2013.01); *F16B 23/00* (2013.01); *H05K 5/03* (2013.01); *H05K 7/20009* (2013.01)

(58) Field of Classification Search
None
See application file for complete search history.

(56) References Cited

U.S. PATENT DOCUMENTS

| | | | | | |
|---|---|---|---|---|---|
| 5,353,949 | A | * | 10/1994 | Seibert | B01D 46/0094 220/372 |
| 5,522,769 | A | * | 6/1996 | DeGuiseppi | F21S 45/33 454/270 |
| 5,713,972 | A | * | 2/1998 | Snyder, Sr. | B01D 46/26 55/385.3 |
| 2002/0090506 | A1 | * | 7/2002 | Protzner | H05K 5/0213 428/461 |
| 2005/0227610 | A1 | * | 10/2005 | Zukor | G03B 17/02 454/339 |

OTHER PUBLICATIONS

ET Metals Co. (Year: 2012).*
ND Plastisol Underhead Fastener Sealant (Year: 2018).*

* cited by examiner

*Primary Examiner* — Timothy J Thompson
*Assistant Examiner* — John B Freal
(74) *Attorney, Agent, or Firm* — Harrington & Smith

(57) ABSTRACT

A device includes a head having a material having a plurality of pores, wherein at least some of the pores from the plurality of pores each have a size that is smaller than a water molecule and larger than an air molecule such that the air molecules can pass through the pores and the water molecules are prevented from passing through the pores; and an elongated body extending from the head and having a thread on an outer surface thereof and having a conduit extending longitudinally through the elongated body to the head. The device is configured to fasten a first surface to a second surface using the thread of the elongated body.

19 Claims, 10 Drawing Sheets

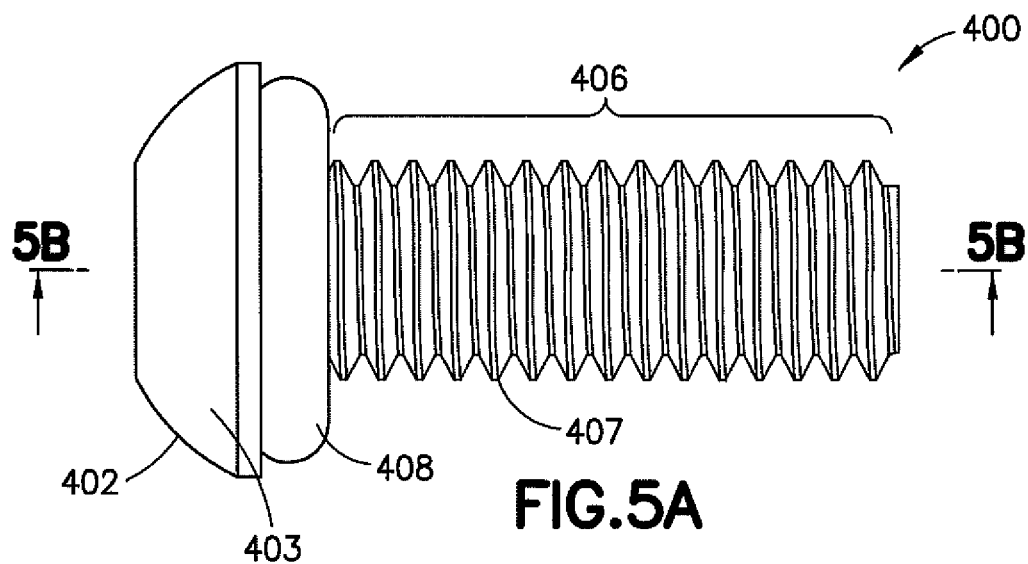
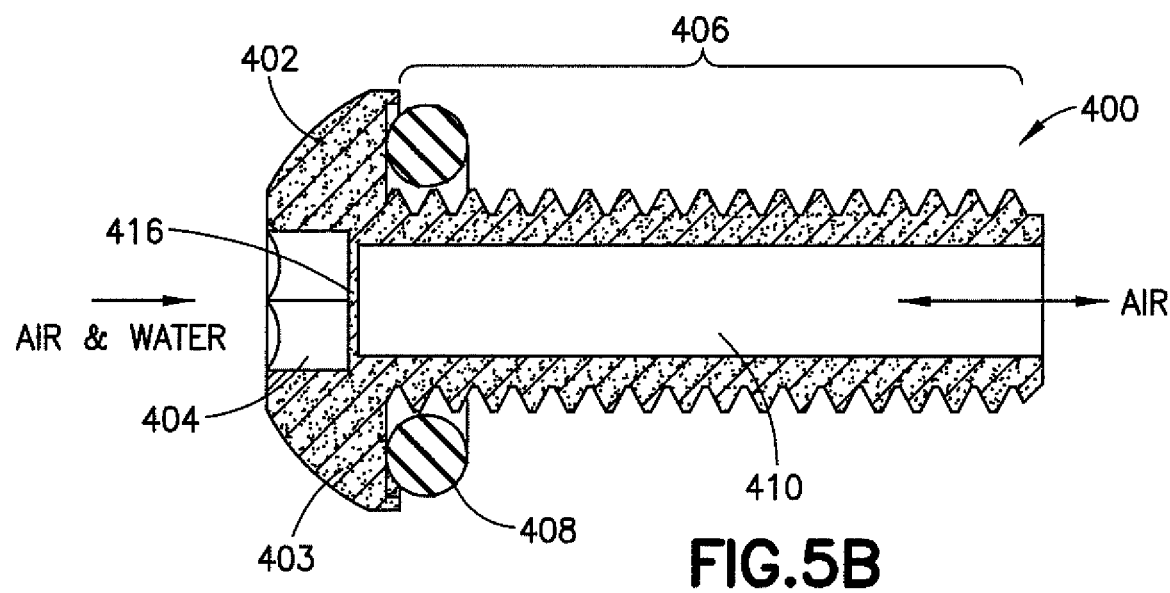

US 11,661,965 B2

FASTENER AND VENT DEVICE FOR TELECOMMUNICATIONS EQUIPMENT

CROSS REFERENCE

This application claims the benefits of Provisional Patent Application No. 62/914,707, filed Oct. 14, 2019, the contents of which are hereby incorporated by reference in their entirety.

BACKGROUND

Technical Field

The exemplary and non-limiting embodiments described herein relate to, but are not limited to, cellular network technologies and cellular radio implementation and, in some examples, to associated hardware for radio access networks (RAN).

Brief Description of Prior Developments

Telecommunications equipment installed outdoors is typically exposed to a wide range of environmental hazards that can affect the performance, reliability, and life expectancy of the sensitive electronics within. Because of this, telecommunications equipment intended for outdoor use is generally housed in environmentally sealed enclosures. Pressure differentials are created when a sealed enclosure is exposed to rapid, extreme, or recurring changes in ambient conditions. In particular, changes in atmospheric temperature or the heating and cooling cycles of an internal heat source can cause such pressure differentials within the sealed enclosure.

SUMMARY

The following summary is merely intended to be exemplary. The summary is not intended to limit the scope of the claims.

In accordance with one aspect, a device comprises a head comprising a material having a plurality of pores, wherein at least some of the pores from the plurality of pores each have a size that is smaller than a water molecule and larger than an air molecule such that the air molecules can pass through the pores and the water molecules are prevented from passing through the pores; and an elongated body extending from the head and having a thread on an outer surface thereof and having a conduit extending longitudinally through the elongated body to the head. The device is configured to fasten a first surface to a second surface using the thread of the elongated body.

In another aspect, a device comprises a cylindrical member having an outer threaded surface; a head at one end of the cylindrical member, the head comprising a material having a plurality of pores, wherein at least some of the pores from the plurality of pores each have a size that is smaller than a water molecule and larger than an air molecule such that the air molecules can pass through the pores and the water molecules are prevented from passing through the pores; and a conduit extending longitudinally through the cylindrical member to the head. The outer threaded surface of the cylindrical member is configured to fasten a first surface to a second surface.

In another aspect, an apparatus comprises an enclosure configured to contain electronic components; a cover configured to be removably attached to the enclosure; and a device configured to fasten the cover to the enclosure. The device comprises a head comprising a material having a plurality of pores, wherein at least some of the pores each have a size that is smaller than a water molecule and larger than an air molecule such that the air molecules can pass through the pores and the water molecules are prevented from passing through the pores, and an elongated body extending from the head and having a thread formed on an outer surface thereof and having a conduit extending longitudinally through the elongated body to the head. Threadedly receiving the elongated body through the cover and into the enclosure fastens the cover to the enclosure.

BRIEF DESCRIPTION OF THE DRAWINGS

The foregoing aspects and other features are explained in the following description, taken in connection with the accompanying drawings, wherein:

FIG. 5A is side view of another exemplary embodiment of a screw having a vent incorporated therein; and FIG. 5B is a side sectional view of the vent/screw of FIG. 5A.

DETAILED DESCRIPTION OF EMBODIMENT

Figure 1A:
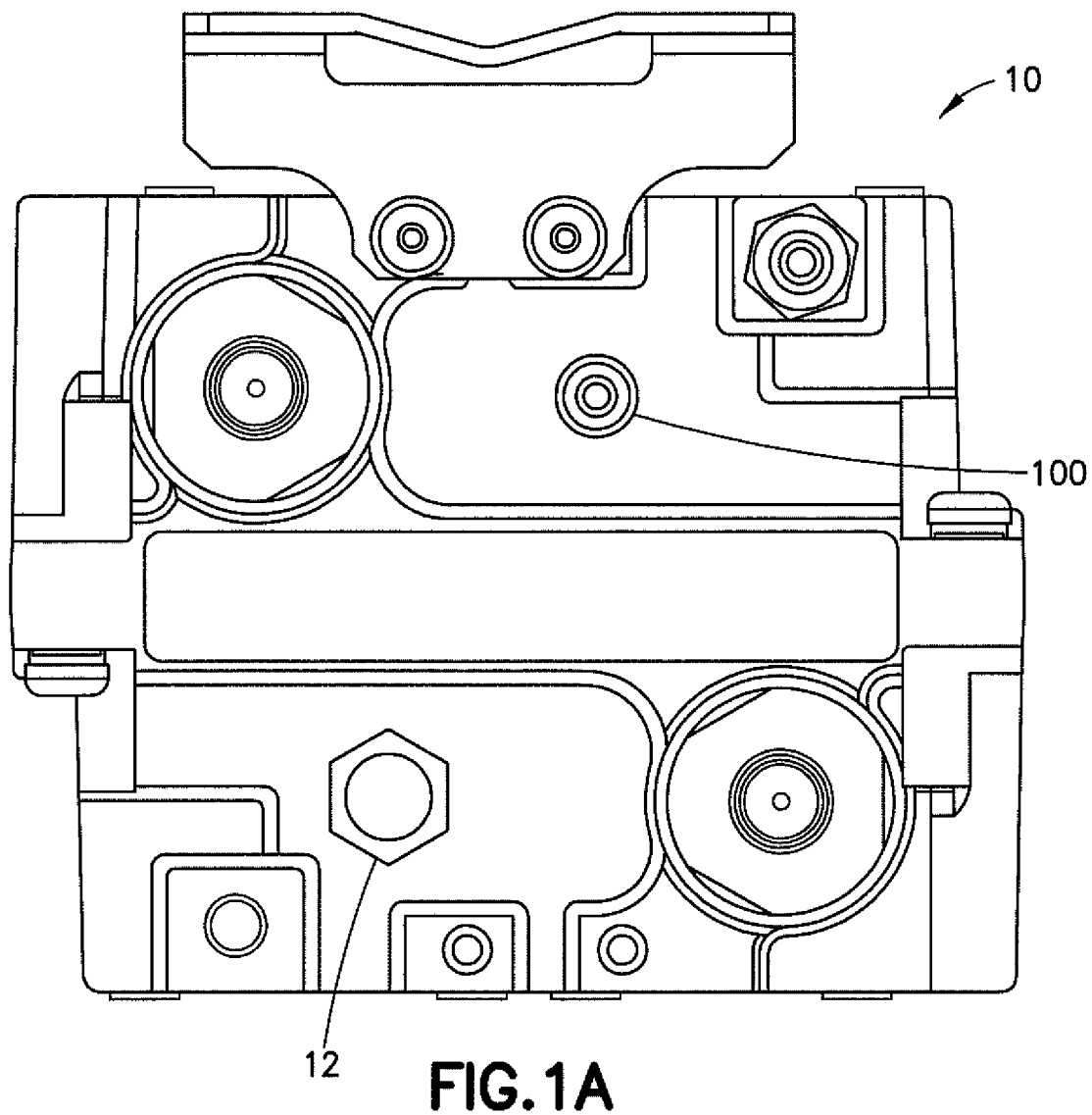
FIGS. 1A-1C are illustrations of various configurations of cellular radio equipment in which exemplary embodiments of vents are incorporated into screws used in the assembly of the equipment.

The word "exemplary" is used herein to mean "serving as an example, instance, or illustration." Any embodiment described herein as "exemplary" is not necessarily to be construed as preferred or advantageous over other embodiments. All of the embodiments described in this Detailed Description are exemplary embodiments provided to enable persons skilled in the art to make or use the invention and not to limit the scope of the invention which is defined by the claims.

When outdoor telecommunications equipment is housed in an environmentally sealed enclosure, a rapid decrease in temperature, for example, can create a vacuum inside the enclosure. If this pressure differential is not dissipated, the vacuum created may place continual stress on the housing seals. Over time, this can cause the seals to fail, allowing moisture and other contaminants such as dust, dirt, and other particulates to be drawn inside the enclosure.

Even in the absence of failed seals, humid air can get inside enclosures by diffusion. When water vapor enters a sealed enclosure and is unable to escape, it may condense to a liquid state and compromise the function of the unit.

Outdoor-rated telecom equipment, as well as other types of outdoor equipment, that requires environmentally sealed enclosures typically uses some type of vent to allow air to flow into and out of the enclosure as the unit heats up, cools down, and when the atmospheric pressure changes. These vents allow air to pass, but prevent ingress of water and other contaminants that may harm the inner components of the unit. Allowing air to pass ensures that there is no pressure differential that could cause water or other contaminants to be pulled into the unit. The current technology for these vents requires a relatively large hole to be added to the housing of the enclosure. The hole is then covered with a gas-permeable membrane, like Gore-Tex, that allows only air to pass through. In practice, these types of vents are often large plastic screw-in vents or adhesive vents. Irrespective of whether the vents are of the screw-in type or the adhesive type, these designs typically require large surface areas.

In cellular radio implementation hardware involving newer RAN technologies, the 5G units are relatively small compared to existing 3G and 4G units that provide similar functions. One or more vents may be incorporated into such units in efforts to reliably protect against premature seal failure to preserve the integrity of an enclosure. However, difficulties may be encountered with regard to fitting some existing commercial vents into the smaller 5G units. Furthermore, in non-vented housings, pressure differentials as low as 1 pound per square inch (psi) can cause seals to leak after repeated temperature cycles. Thus, the architectures of 5G units create a need for a new vent design that is relatively small compared to currently available technology.

The exemplary embodiments described herein are directed to the combination of a fastener, hereinafter referred to as a screw, and a vent into one piece for use in the assembly of cellular radio equipment and associated hardware. The combined screw and vent is miniaturized or otherwise sized to have minimal footprints on the equipment and hardware. For example, one or more screws holding a removable cover to an environmentally scaled housing for outdoor-rated telecom equipment may have a vent in the form of a porous barrier in an opening that extends from a head of the screw, longitudinally through the body of the screw, to an opening at a tail end of the screw. Sintered materials may be used in the screw to provide the porous barrier to prevent the transfer of water vapor while allowing for the diffusion of air. The sintered materials may be metallic or ceramic.

Figure 2A:
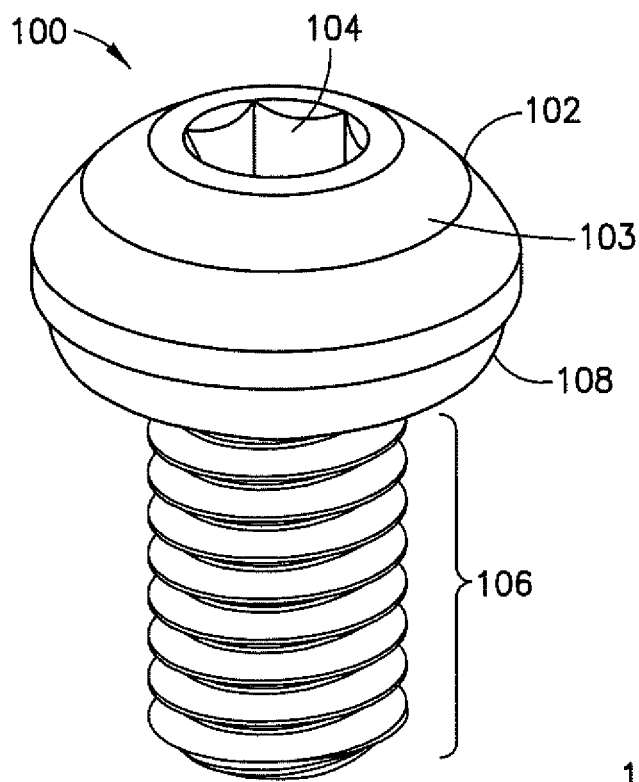
FIG. 2A is a perspective view of one exemplary embodiment of a screw having a vent incorporated therein.
Figure 2B:
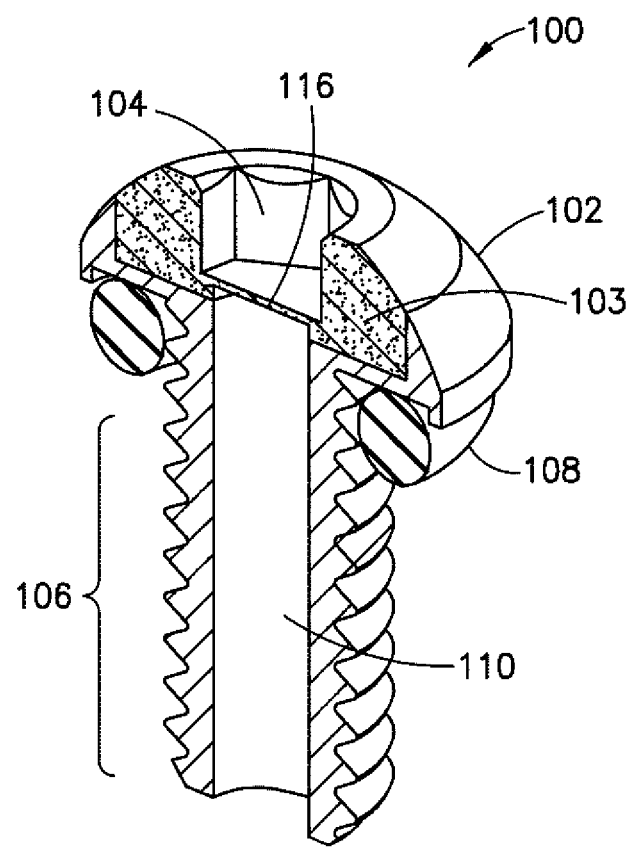
FIG. 2B is a cutaway perspective view of the vent/screw of FIG. 2A.
Figure 2C:
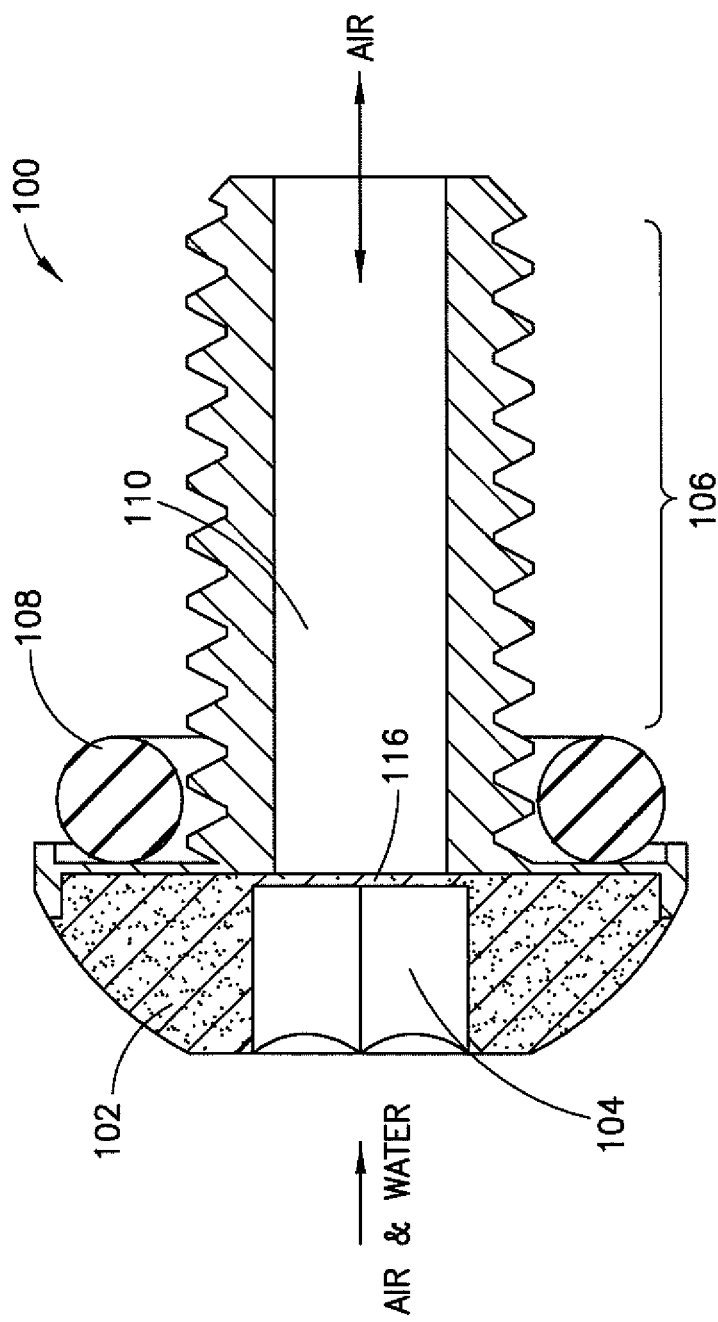
FIG. 2C is a side sectional view of the vent/screw of FIG. 2A.

In the exemplary embodiments described herein, the combined screw and vent allows for both operation as a fastener and the passage of air. The screw portions may be made essentially from one of two types of stainless steel, the bodies of which are generally made from solid metal or powdered sintered stainless steel and the porous barrier or filter part of the vent portions generally being made from powdered or gravity sintered stainless steel or porous sintered ceramic, as shown in FIGS. 3A-5B. The porous barrier can be formed with the head of the screw as shown in FIGS. 2A-2C, or inserted inside the head of the screw as shown in FIGS. 3A-4C. An O-ring or molded plastisol can be added to provide sealing when the apparatuses described herein are used as fasteners in the assembly of an enclosure. In the embodiment shown in FIGS. 5A and 5B, a combined screw/vent can be made as a unitary piece from sintered metal (such as stainless steel, titanium, aluminum, copper, bronze, brass, nickel, or non-stainless steel) or sintered ceramic. In some embodiments the combined screw/vent device may be used with a rubber O-ring (or plastisol). When the material is stainless steel, the head and body of the screw portion and the porous barrier for use in the filter or vent portion can be made from a stainless steel powder that is compacted at very high pressures in a mechanical press. The powders from which the porous barriers are formed are gas atomized, the particles of such powders being generally spherical in shape and uniform in size. The particle size of the powder controls the pore size of the final filtering of airflow through the porous barrier.

In some embodiments, the porous barriers can be gravity sintered, which means that they are not compacted. These powders are weighed and poured into a graphite boat. This boat is heated in a furnace to minimally bond (fuse) particles of the powder together. The pores sizes of such gravity sintered barriers can be precisely controlled so that the final product, when incorporated into the combined screw and vent, can effectively filter out water particles and allow air to pass.

Those of ordinary skill in the related art will realize that sintering may be carried out using other processes. However, within the context of the present disclosure, the term "sintered" when referring to a material, is not to be construed to be limited to a product made using any specific sintering process, but to any product in which the resulting material presents a number of particles bonded together and forming a body having pores.

Figure 1B:
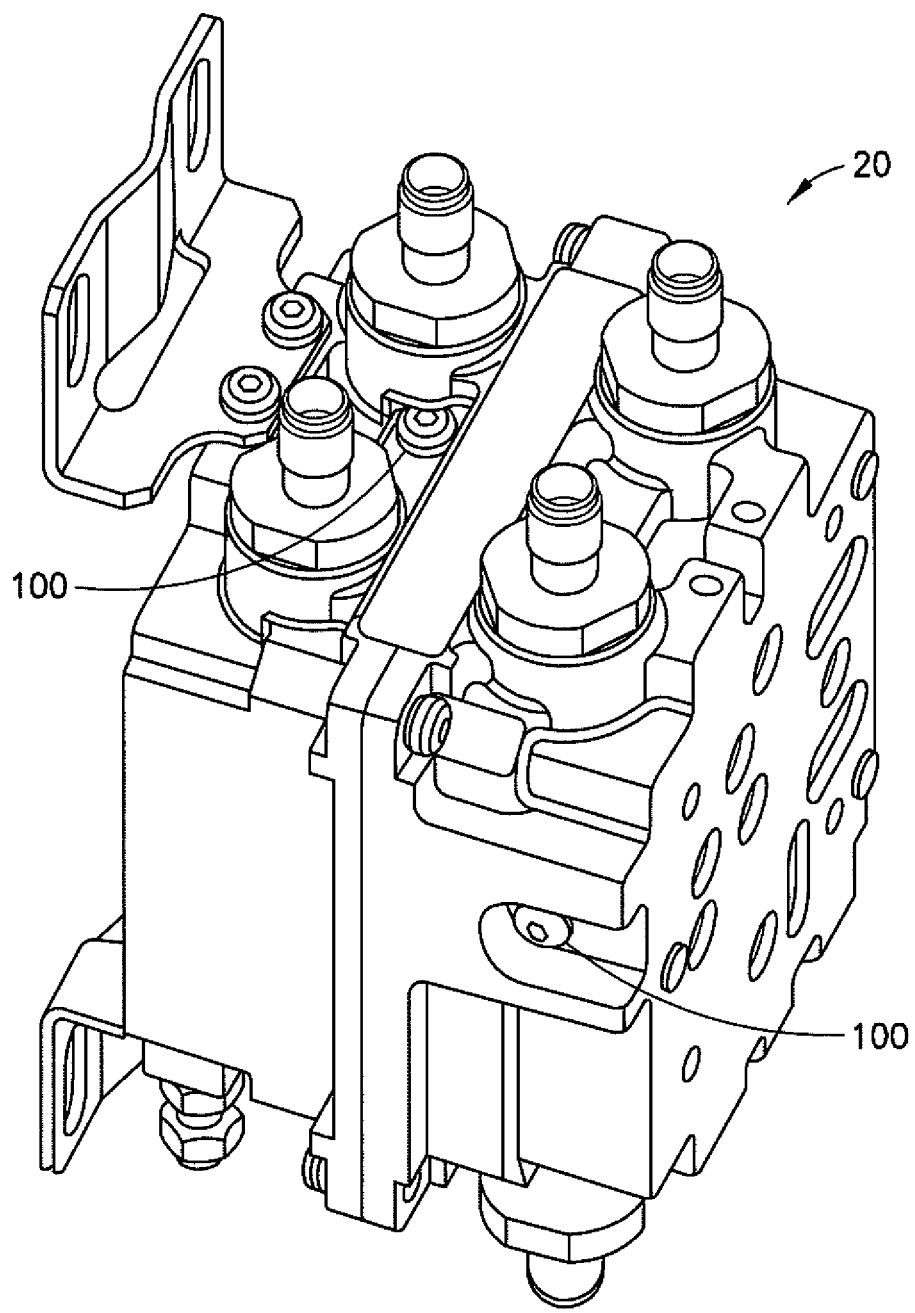
Figure 1C:
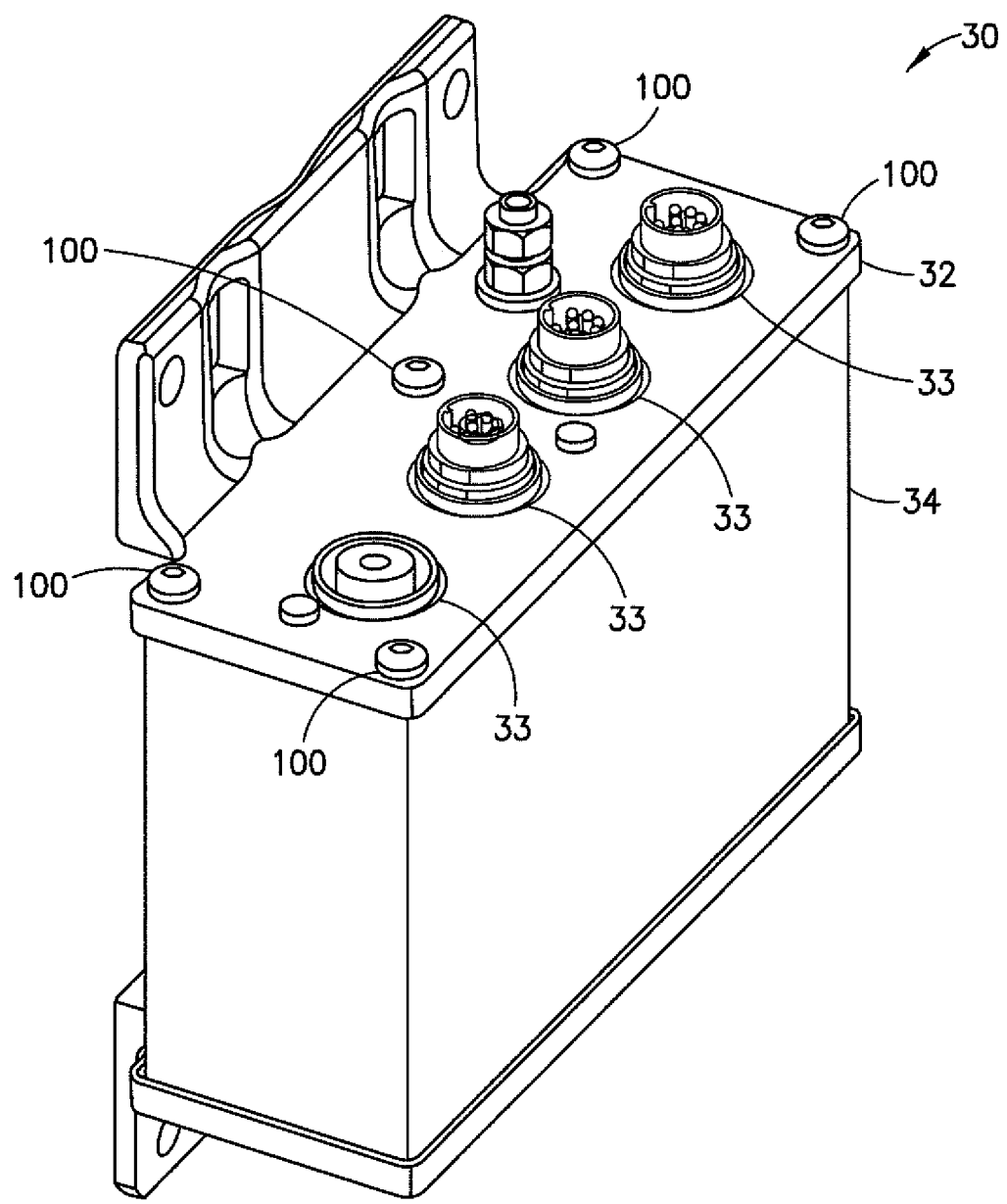

Referring to FIGS. 1A-1C, exemplary configurations of cellular radio equipment are shown. In FIG. 1A, one embodiment of an enclosure 10 includes both a typical conventional vent 12 and an exemplary embodiment of a vent incorporated into a screw, hereinafter referred to as "vent 100," thereby illustrating a comparison between the size of the conventional vent 12 and the vent 100. In FIG. 1B, another embodiment of an enclosure 20 includes only the vent 100. In FIG. 1C, another embodiment of an enclosure 30, which may be a housing of a site sharing device or similar cellular radio equipment, includes a plurality of vents 100 that can be used as some or all of the mounting screws holding a cover 32 onto a housing 34. The cover may include one or more connection ports 33. As shown in FIGS. 1A-1C, the vent 100 can be made of a very small size and used in any phase of the assembly of an enclosure for radio equipment, particularly as a fastener for attaching, for example, covers to airtight enclosures or similar housings, and being located interior to an environmental gasket, such as an O-ring or plastisol sealing the cover to the housing, thereby providing mechanical fastening for the cover as well as a breathing vent for equalizing the pressure in the enclosure.

Referring to FIGS. 2A-2C, one exemplary embodiment of the vent 100 is shown. As shown in FIG. 2A, the vent 100 comprises a head 102 having an opening 104 formed therein and a body 106 extending from the head 102. The head 102 may be rounded as shown, although other configurations (for example, flat or prism shapes) are within the scope of the exemplary embodiments described. The opening 104 may include side surfaces defining a hex-shape or the like to accommodate a tool having a corresponding configuration (although other shapes are possible). The outer surface of the body 106 may define threads (for example, an M4 thread or any similar thread of suitable size). A compressible member such as an O-ring 108 (or washer or gasket) may be positioned under the head 102 and around the body 106 to provide sealing contact between a bottom side of the head 102 and a surface into which the vent 100 is inserted or used as a fastener.

As shown in FIG. 2B, the body 106 comprises a conduit 110 extending longitudinally therethrough from the head 102 to the opposite end of the body 106. A porous barrier 116 defining a bottom surface of the opening 104 is positioned at an end of the conduit 110 adjacent to the head 102. The porous barrier 116 may be a thin layer of porous material that is integrally formed with the material of the head 102 and that separates the opening 104 in the head 102 from the conduit 110.

As shown in FIG. 2C, the head 102 comprises powdered metal 103, and the porous barrier 116 comprises the powdered metal in a sintered form and integrally formed with the head 102. The porosity of the porous barrier 116 is such that airflow can be maintained from the opening 104, through the material of the porous barrier 116, and to the conduit 110 with most or all of the moisture in the air being stopped at the porous barrier 116 on the outer environment side of the porous barrier 116. In doing so, the airflow through the conduit 110 from the porous barrier 116 is substantially moisture-free. Depending upon pressures and temperatures, the airflow may also be from the conduit 110, through the porous barrier 116, and to the outer environment. In the exemplary embodiment shown, the body 106 comprises stainless steel (although other materials are possible).

Figure 3A:
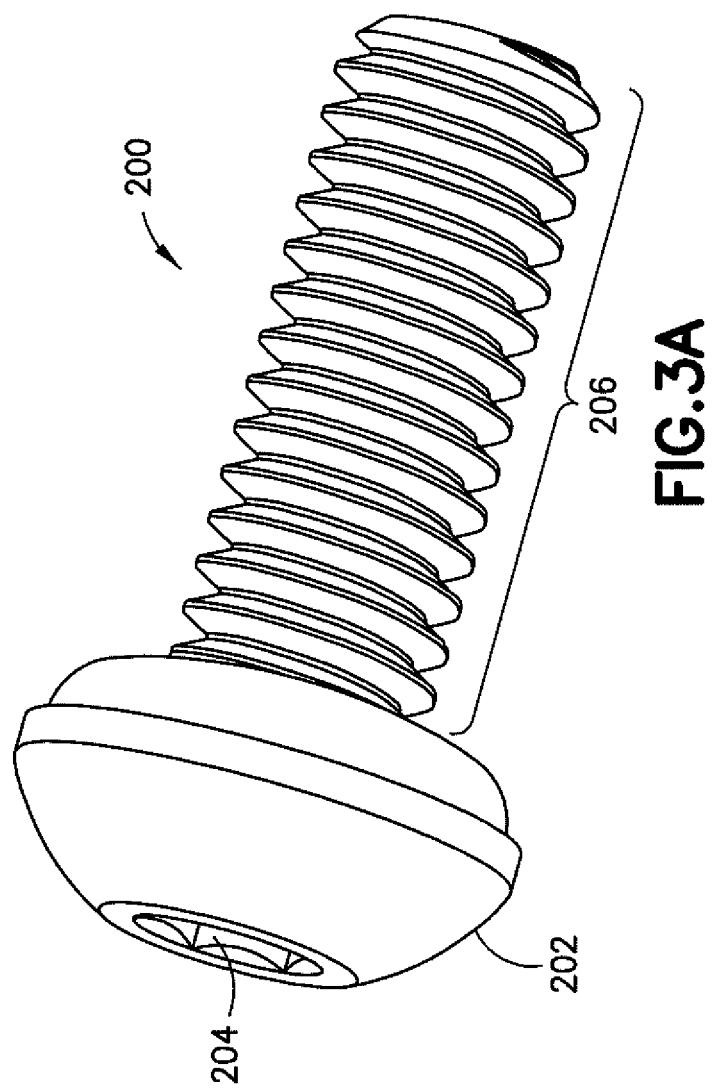
FIG. 3A is a perspective view of another exemplary embodiment of a screw having a vent incorporated therein.
Figure 3B:
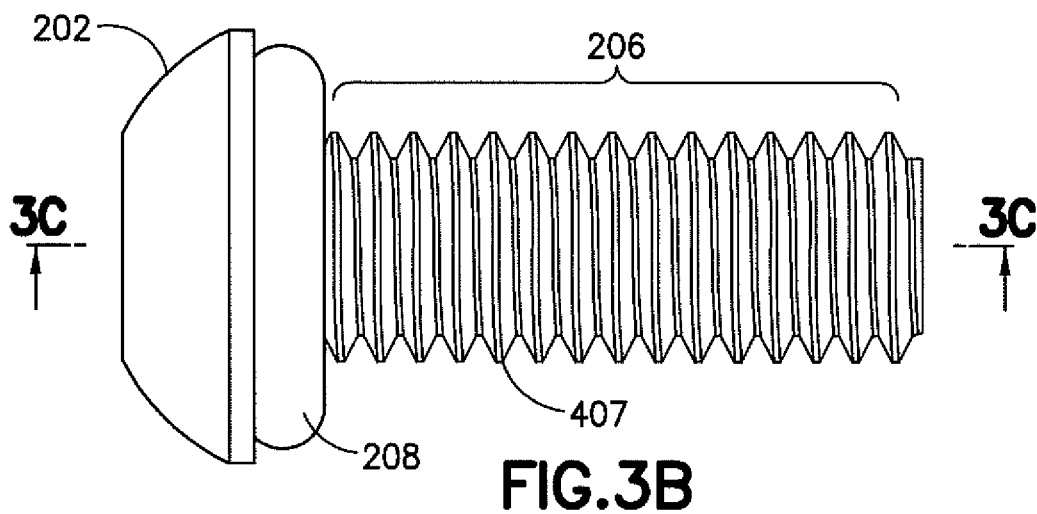
FIG. 3B is a side view of the vent/screw of FIG. 3A.
Figure 3C:
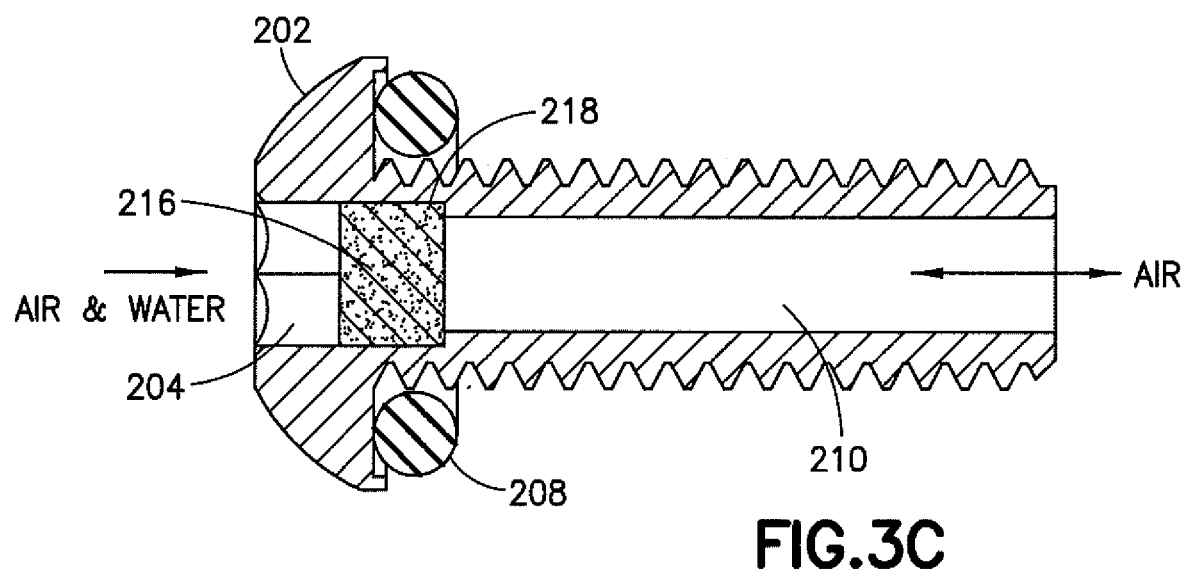
FIG. 3C is a side sectional view of the vent/screw of FIG. 3A.

Referring now to FIGS. 3A-3C, another exemplary embodiment of the vent is shown generally at 200 and is hereinafter referred to as "vent 200." As shown in FIGS. 3A and 3B, the vent 200 comprises a head 202 with an opening 204 and a body 206. The outer surface of the body 206 may define threads 207 such that the vent 200 can operate as a fastener in the assembly of an enclosure for cellular radio equipment (or other equipment). A compressible member such as an O-ring 208 (or washer or gasket) may be positioned under the head 202 and around the body 206 to provide sealing contact between a bottom side of the head 202 and a surface into which the vent 200 is fastened.

As shown in FIG. 3C, the head 202 and the body 206 comprise stainless steel formed as a unitary piece. The opening 204 in the head 202 (which may have sides that define a hex-shaped or the like) may have a larger diameter than a diameter of a conduit 210 extending longitudinally through the body 206, thereby forming a shoulder 218 at a transition from the opening 204 in the head 202 to the conduit 210. A porous barrier 216 in the form of a sintered ceramic material may be located in the opening 204 at the shoulder 218 to separate the opening 204 from the conduit 210. As with the vent 100, the porosity of the porous barrier 216 is such that airflow can be maintained from the opening 204, through the material of the porous barrier 216, and to the conduit 210 with most or all of the moisture in the air being stopped at the porous barrier 216. In doing so, the airflow through the conduit 210 is substantially moisture-free. The airflow may also be from the conduit 210 back through the porous barrier 216.

Figure 4A:
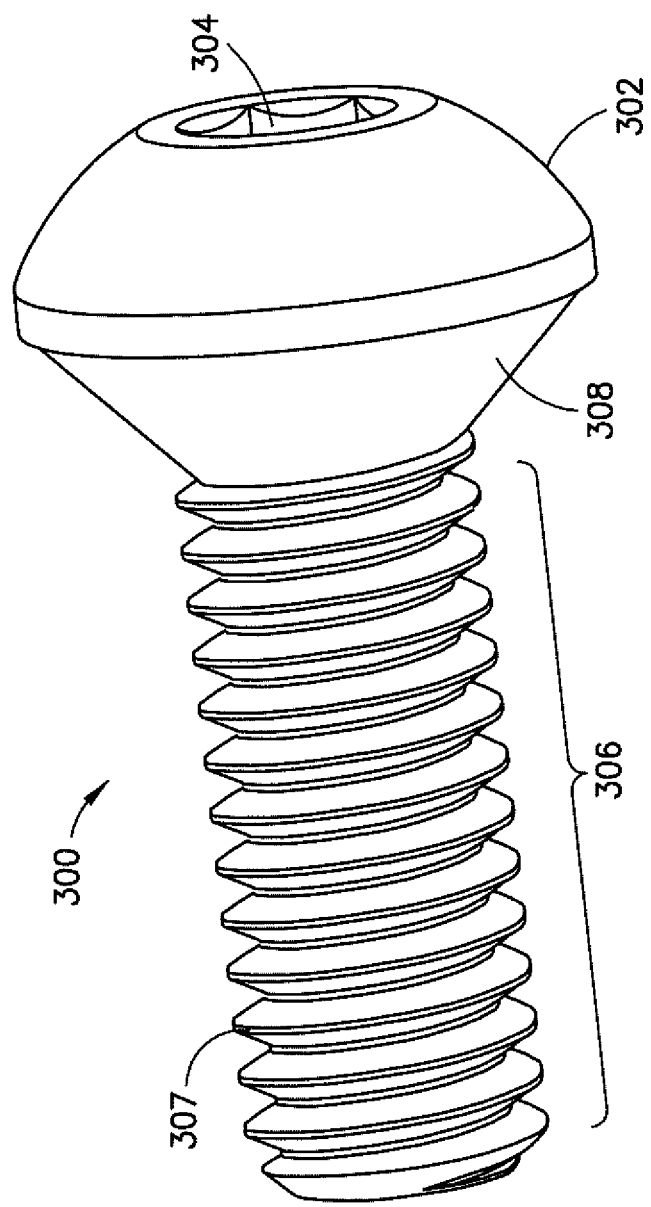
FIG. 4A is a perspective view of another exemplary embodiment of a screw having a vent incorporated therein.
Figure 4B:
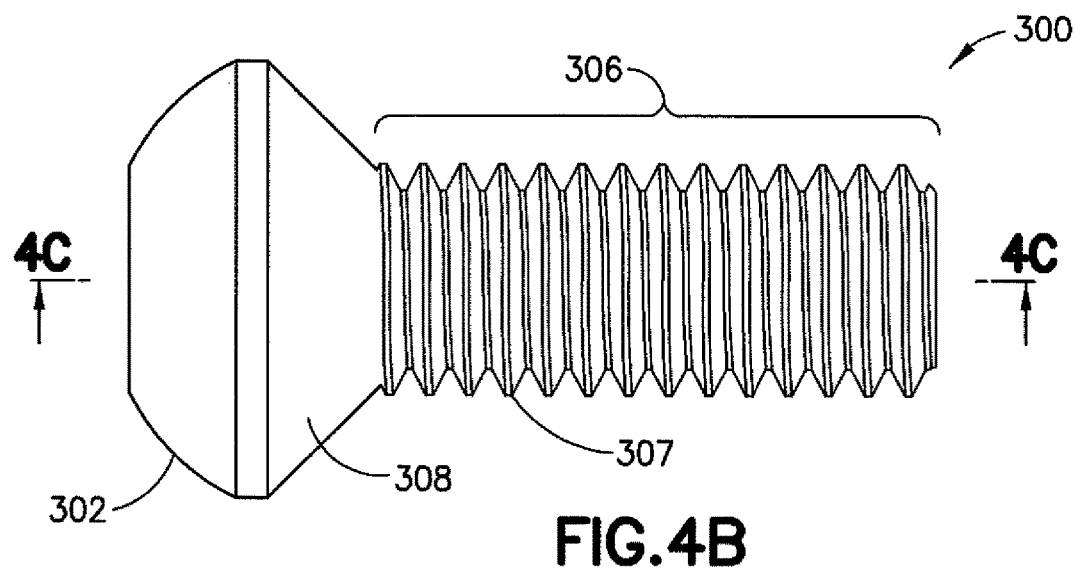
FIG. 4B is a side view of the vent/screw of FIG. 4A.

Referring now to FIGS. 4A-40, another exemplary embodiment of the vent is shown generally at 300 and is hereinafter referred to as "vent 300." As shown in FIGS. 4A and 4B, the vent 300 comprises a head 302 with an opening 304 and a body 306. The outer surface of the body 306 may define threads 307. Instead of an O-ring, a plastisol gasket 308 (or washer or ring) may be positioned under the head 302 and around the body 306 to provide the sealing contact between a bottom side of the head 302 and a surface into which the vent 300 is fastened. Plastisol is generally a suspension of polymer in a liquid plasticizer.

Figure 4C:
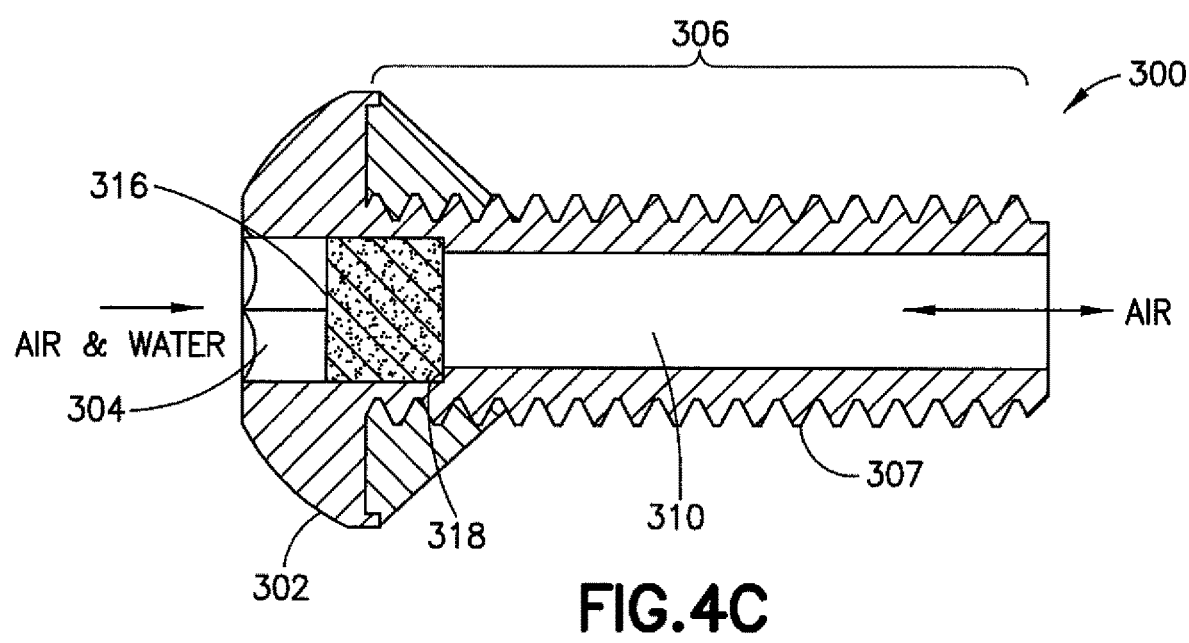
FIG. 4C is a side sectional view of the vent/screw of FIG. 4A.

As shown in FIG. 4C, similar to the vent 200 in FIGS. 3A-3C, the head 302 and the body 306 comprise stainless steel formed as a unitary piece. The opening 304 in the head 302 (which may include side surfaces defining a hex-shape or the like) may have a larger diameter than a diameter of a conduit 310 extending longitudinally through the body 306, thereby forming a shoulder 318 at a transition from the opening 304 in the head 302 to the conduit 310. A porous barrier 316 in the form of a sintered ceramic material may be located in the opening 304 at the shoulder 318. As with the vent 100 and the vent 200, the porosity of the porous barrier 316 is such that airflow can be maintained from the opening 304, through the material of the porous barrier 316, and to the conduit 310 with most or all of the moisture in the air being stopped at the porous barrier 316. In doing so, the airflow through the conduit 310 is substantially moisture-free. The airflow may also be from the conduit 310 back through the porous barrier 316.

Referring now to FIGS. 5A and 5B, another exemplary embodiment of the vent is shown generally at 400 and is hereinafter referred to as "vent 400." As shown in FIG. SA, the vent 400 comprises a head 402 with an opening 404 (FIG. 5B) and a body 406. The outer surface of the body 406 may define threads 407. A compressible member such as an O-ring 408 (or a washer, gasket, or plastisol ring) may be positioned under the head 402 and around the body 406 to provide the sealing contact between a bottom side of the head 402 and a surface into which the vent 400 is fastened. The O-ring 408 (or washer or gasket) may be coupled to an underside of the head 402 adhesively, or it may be positioned under the underside of the head 402 around the body 406 using a friction fit.

As shown in FIG. 5B, the head 402 and the body 406 comprise a porous material 403 formed as a unitary piece. The porous material 403 is hereinafter referred to as being a stainless steel, although other materials such as ceramic, titanium, aluminum, copper, bronze, brass, nickel, as well as non-stainless steels, and the like may be used. The porous material 403 may be sintered. The head 402 includes a porous barrier 416 of the porous stainless steel at a transition from an opening 404 (having sides defining a hex-shape or the like) in the head 402 to a conduit 410 extending longitudinally through the body 406. The porous barrier 416 may be integral with the sides or surfaces defining the opening 404 and formed with the head 402 and the body 406. The porosity of the porous barrier 416 is such that airflow can be maintained from the opening 404, through the material of the porous barrier 416, and to the conduit 410 with most or all of the moisture in the air being stopped at the porous barrier 416. The airflow may also be from the conduit 410 back through the porous barrier 416.

In forming the head 402, the body 406, and the porous barrier 416 as a unitary piece from one piece of porous stainless steel or porous sintered stainless steel such that the head 402, the body 406, and the porous barrier 416 are integral with each other, the number of parts is minimized to just one, which in turn minimizes the cost of manufacturing the part. Furthermore, forming the combined screw/vent from a single piece of porous sintered stainless steel allows more airflow through the vent 400 for a given screw diameter, since there is no outer body (the outer body being impermeable to air) taking up a portion of the screw volume. Since an increased amount of airflow is allowed with a one piece design, relative to a multi-piece design, a screw incorporating a vent, as described in the exemplary embodiments herein, can be made smaller and still allow for sufficient airflow while operating as a fastening means.

In one example embodiment, a device comprises a head comprising a material having a plurality of pores, wherein at least some of the pores from the plurality of pores each have a size that is smaller than a water molecule and larger than an air molecule such that the air molecules can pass through the pores and the water molecules are prevented from passing through the pores; and an elongated body extending from the head and having a thread on an outer surface thereof and having a conduit extending longitudinally through the elongated body to the head. The device is configured to fasten a first surface to a second surface using the thread of the elongated body.

The elongated body may further comprise the material having the plurality of pores, wherein at least a portion of the pores each have a size that is smaller than a water molecule and larger than an air molecule such that the air molecules can pass through the pores and the water molecules are prevented from passing through the pores. The material having the plurality of pores may be a sintered material. The sintered material may be stainless steel. The sintered material may be non-stainless steel, ceramic, titanium, aluminum, copper, bronze, brass, or nickel. The apparatus may further comprise a barrier in the head or the conduit, or in both, the barrier comprising the material having the plurality of pores. The apparatus may further comprise a compressible member positioned at an underside of the head and around the elongated body. The compressible member may be an O-ring, a washer, or a gasket. The compressible member may comprise plastisol. The head and the elongated body may form a unitary piece of the material having the plurality of pores.

In another example embodiment, a device comprises a cylindrical member having an outer threaded surface; a head at one end of the cylindrical member, the head comprising a material having a plurality of pores, wherein at least some of the pores from the plurality of pores each have a size that is smaller than a water molecule and larger than an air molecule such that the air molecules can pass through the pores and the water molecules are prevented from passing through the pores; and a conduit extending longitudinally through the cylindrical member to the head. The outer threaded surface of the cylindrical member is configured to fasten a first surface to a second surface.

The cylindrical member may comprise the material having the plurality of pores, wherein at least some of the pores from the plurality of pores each have a size that is smaller than a water molecule and larger than an air molecule such that the air molecules can pass through the pores and the water molecules are prevented from passing through the pores. The material of the head having the plurality of pores may be a sintered material. The device may further comprise a compressible member positioned around the cylindrical member and adjacent to the head, wherein the compressible member provides a substantially airtight seal when compressed between the head and the first surface. The cylindrical member and the head may form a unitary member. The first surface may be a surface of an enclosure configured to contain electronic components and the second surface may be a surface of a cover configured to be removably attached to the enclosure.

In another example embodiment, an apparatus comprises an enclosure configured to contain electronic components; a cover configured to be removably attached to the enclosure; and a device configured to fasten the cover to the enclosure. The device comprises a head comprising a material having a plurality of pores, wherein at least some of the pores each have a size that is smaller than a water molecule and larger than an air molecule such that the air molecules can pass through the pores and the water molecules are prevented from passing through the pores, and an elongated body extending from the head and having a thread formed on an outer surface thereof and having a conduit extending longitudinally through the elongated body to the head. Threadedly receiving the elongated body through the cover and into the enclosure fastens the cover to the enclosure.

The elongated body may comprise the material having the plurality of pores, wherein at least some of the pores each have a size that is smaller than a water molecule and larger than an air molecule such that the air molecules can pass through the pores and the water molecules are prevented from passing through the pores. The material having the plurality of pores may be a sintered material. The sintered material may be stainless steel. The head and the elongated body may form a unitary piece of the material having the plurality of pores. The apparatus may further comprise a compressible member between the head and a surface of the cover, wherein the compressible member provides a substantially airtight seal between the head and the surface of the cover.

It should be understood that the foregoing description is only illustrative. Various alternatives and modifications can be devised by those skilled in the art. For example, features recited in the various dependent claims could be combined with each other in any suitable combination(s). In addition, features from different embodiments described above could be selectively combined into a new embodiment. Accordingly, the description is intended to embrace all such alternatives, modifications, and variances which fall within the scope of the appended claims.

What is claimed is:

1. An apparatus, comprising:
    a head comprising a material having a plurality of pores, wherein at least some of the pores from the plurality of pores each have a size that is smaller than a water molecule and larger than an air molecule such that the air molecules can pass through the pores and the water molecules are prevented from passing through the pores; and
    an elongated body extending from the head and having a thread on an outer surface thereof and having a conduit extending longitudinally through the elongated body to the head;
    wherein the device is configured to fasten a first surface to a second surface using the thread of the elongated body;
    wherein the head and the elongated body form a unitary piece of the material having the plurality of pores.

2. The apparatus of claim 1, wherein the elongated body further comprises the material having the plurality of pores, wherein at least a portion of the pores each have a size that is smaller than a water molecule and larger than an air molecule such that the air molecules can pass through the pores and the water molecules are prevented from passing through the pores.

3. The apparatus of claim 1, wherein the material having the plurality of pores is a sintered material.

4. The apparatus of claim 3, wherein the sintered material is stainless steel.

5. The apparatus of claim 3, wherein the sintered material is non-stainless steel, ceramic, titanium, aluminum, copper, bronze, brass, or nickel.

6. The apparatus of claim 1, further comprising a barrier in the head or the conduit, or in both, the barrier comprising the material having the plurality of pores.

7. The apparatus of claim 1, further comprising a compressible member positioned at an underside of the head and around the elongated body.

8. The apparatus of claim 7, wherein the compressible member is an O-ring, a washer, or a gasket.

9. The apparatus of claim 7, wherein the compressible member comprises plastisol.

10. A device, comprising:
a cylindrical member having an outer threaded surface;
a head at one end of the cylindrical member, the head comprising a material having a plurality of pores, wherein at least some of the pores from the plurality of pores each have a size that is smaller than a water molecule and larger than an air molecule such that the air molecules can pass through the pores and the water molecules are prevented from passing through the pores; and
a conduit extending longitudinally through the cylindrical member to the head;
wherein the outer threaded surface of the cylindrical member is configured to fasten a first surface to a second surface;
wherein the cylindrical member and the head form a unitary member.

11. The device of claim 10, wherein the cylindrical member comprises the material having the plurality of pores, wherein at least some of the pores from the plurality of pores each have a size that is smaller than a water molecule and larger than an air molecule such that the air molecules can pass through the pores and the water molecules are prevented from passing through the pores.

12. The device of claim 10, wherein the material of the head having the plurality of pores is a sintered material.

13. The device of claim 10, further comprising a compressible member positioned around the cylindrical member and adjacent to the head, wherein the compressible member provides a substantially airtight seal when compressed between the head and the first surface.

14. The device of claim 10, wherein the first surface is a surface of an enclosure configured to contain electronic components and the second surface is a surface of a cover configured to be removably attached to the enclosure.

15. An apparatus, comprising:
an enclosure configured to contain electronic components;
a cover configured to be removably attached to the enclosure; and
a device configured to fasten the cover to the enclosure, the device comprising,
a head comprising a material having a plurality of pores, wherein at least some of the pores each have a size that is smaller than a water molecule and larger than an air molecule such that the air molecules can pass through the pores and the water molecules are prevented from passing through the pores, and
an elongated body extending from the head and having a thread formed on an outer surface thereof and having a conduit extending longitudinally through the elongated body to the head, and
wherein threadedly receiving the elongated body through the cover and into the enclosure fastens the cover to the enclosure;
wherein the head and the elongated body form a unitary piece of the material having the plurality of pores.

16. The apparatus of claim 15, wherein the elongated body comprises the material having the plurality of pores, wherein at least some of the pores each have a size that is smaller than a water molecule and larger than an air molecule such that the air molecules can pass through the pores and the water molecules are prevented from passing through the pores.

17. The apparatus of claim 15, wherein the material having the plurality of pores is a sintered material.

18. The apparatus of claim 17, wherein the sintered material is stainless steel.

19. The apparatus of claim 15, further comprising a compressible member between the head and a surface of the cover, wherein the compressible member provides a substantially airtight seal between the head and the surface of the cover.

* * * * *